United States Patent
Wajda et al.

(10) Patent No.: US 7,517,814 B2
(45) Date of Patent: Apr. 14, 2009

(54) METHOD AND SYSTEM FOR FORMING AN OXYNITRIDE LAYER BY PERFORMING OXIDATION AND NITRIDATION CONCURRENTLY

(75) Inventors: Cory S. Wajda, Sand Lake, NY (US); Kristen Scheer, Milton, NY (US); Toshihara Furakawa, Essex Junction, VT (US)

(73) Assignees: Tokyo Electron, Ltd., Tokyo (JP); International Business Machines Corporation, Armonk, NY (US)

( * ) Notice: Subject to any disclaimer, the term of this patent is extended or adjusted under 35 U.S.C. 154(b) by 154 days.

(21) Appl. No.: 11/093,262

(22) Filed: Mar. 30, 2005

(65) Prior Publication Data

US 2006/0228871 A1  Oct. 12, 2006

(51) Int. Cl.
*H01L 21/33* (2006.01)

(52) U.S. Cl. ............... 438/777; 438/772; 257/E21.268; 257/E21.285

(58) Field of Classification Search ................. 438/772, 438/777
See application file for complete search history.

(56) References Cited

U.S. PATENT DOCUMENTS

| | | | |
|---|---|---|---|
| 4,919,077 A | 4/1990 | Oda et al. | |
| 5,215,588 A | 6/1993 | Rhieu | |
| 5,217,559 A | 6/1993 | Moslehi et al. | |
| 5,306,671 A | 4/1994 | Ogawa et al. | |
| 5,454,589 A | 10/1995 | Bosio et al. ................. 280/729 |
| 5,478,401 A | 12/1995 | Tsunekawa et al. | |
| 5,518,542 A | 5/1996 | Matsukawa et al. | |
| 5,547,642 A | 8/1996 | Seiwa et al. | |
| 5,585,148 A | 12/1996 | Suzuki et al. | |
| 6,095,085 A | 8/2000 | Agarwal | |
| 6,187,133 B1 | 2/2001 | Knoot | |
| 6,190,458 B1 | 2/2001 | Harada | |
| 6,274,467 B1 | 8/2001 | Gambino et al. | |
| 6,291,867 B1 | 9/2001 | Wallace et al. | |
| 6,426,305 B1 * | 7/2002 | Chou et al. .................. 438/758 |
| 6,444,592 B1 | 9/2002 | Ballantine et al. | |
| 6,451,713 B1 * | 9/2002 | Tay et al. ..................... 438/791 |
| 6,459,126 B1 * | 10/2002 | Mogami et al. ............. 257/350 |
| 6,706,643 B2 * | 3/2004 | Tay et al. ..................... 438/771 |
| 6,780,719 B2 | 8/2004 | Niimi et al. | |

(Continued)

FOREIGN PATENT DOCUMENTS

DE  44 25 830  5/1995

(Continued)

OTHER PUBLICATIONS

International Preliminary Reoprt on Patentability issued in copending related International Application No. PCT/US2006/005418, mailed Oct. 11, 2007.

(Continued)

*Primary Examiner*—Alexander G Ghyka
(74) *Attorney, Agent, or Firm*—DLA Piper LLP US

(57) ABSTRACT

A method for preparing an oxynitride film on a substrate comprising forming the oxynitride film by exposing a surface of the substrate to oxygen radicals and nitrogen radicals formed by plasma induced dissociation of a process gas comprising nitrogen and oxygen using plasma based on microwave irradiation via a plane antenna member having a plurality of slits.

37 Claims, 4 Drawing Sheets

U.S. PATENT DOCUMENTS

| | | |
|---|---|---|
| 6,844,234 B2 | 1/2005 | Eguchi et al. |
| 6,927,112 B2 | 8/2005 | Igeta et al. |
| 6,933,248 B2 | 8/2005 | Grider et al. |
| 2002/0146914 A1 | 10/2002 | Huang et al. |
| 2003/0124873 A1 | 7/2003 | Xing et al. |
| 2003/0148628 A1 | 8/2003 | Tay et al. |
| 2003/0170945 A1 | 9/2003 | Igeta et al. |
| 2004/0023513 A1 | 2/2004 | Aoyama et al. |
| 2004/0053515 A1 | 3/2004 | Comita et al. |
| 2004/0142577 A1 | 7/2004 | Sugawara et al. |
| 2005/0006674 A1 | 1/2005 | Eguchi et al. |
| 2005/0170541 A1 | 8/2005 | Igeta et al. |
| 2005/0202662 A1 | 9/2005 | Joshi et al. |
| 2006/0051506 A1 | 3/2006 | Senzaki et al. |

FOREIGN PATENT DOCUMENTS

| | | | |
|---|---|---|---|
| DE | 100 14 888 | | 11/2001 |
| EP | 0 299 246 | | 1/1989 |
| EP | 0 661 385 | | 7/1995 |
| EP | 0 978 442 | | 2/2000 |
| EP | 1361605 | | 11/2003 |
| EP | 1 361 605 | * | 12/2003 |
| EP | 1 453 083 A1 | | 9/2004 |
| JP | 62-027573 | | 2/1987 |
| JP | 62-237729 | | 10/1987 |
| JP | 63-204616 | | 8/1988 |
| JP | 02-308536 | | 12/1990 |
| JP | 04-186825 | | 7/1992 |
| JP | 04-274317 | | 9/1992 |
| JP | 05-013756 | | 1/1993 |
| JP | 7-29827 | | 1/1995 |
| JP | 08-078338 | | 3/1996 |
| JP | 11-150111 | | 6/1999 |
| JP | 2000-031060 | | 1/2000 |
| JP | 2001-012917 | | 1/2001 |
| JP | 2002-118477 | | 4/2002 |
| JP | 2002-353995 | | 12/2002 |
| JP | 2004-006614 | | 1/2004 |
| JP | 2006-121106 | | 5/2006 |

OTHER PUBLICATIONS

International Preliminary Reoprt on Patentability issued in copending related International Application No. PCT/US2006/005432, mailed Oct. 11, 2007.
Office Action, U.S. Appl. No. 11/231,335 mailed Jan. 15, 2008.
Office Action issued in copending related U.S. Appl. No. 11/093,260, mailed May 9, 2008.
Foreign Office Action issued in Taiwanese Application No. 095109279, mailed Jul. 30, 2008.
English language translation of Foreign Office Action issued in Taiwanese Application No. 095109279, mailed Jul. 30, 2008.
Jun-Ying Zhang et al., "Low Temperature Photo-Oxidation of Silicon Using a Xenon Excimer Lamp", Appl. Phys. Lett., Nov. 17, 1997, pp. 2964-2966, Lett 71, No. 20, The American Institute of Physics.
Jun-Ying Zhang et al., "Low Temperature Photo-Oxidation of Silicon Using Deep UV Radiation", Electronics Letters, vol. 32, No. 22, pp. 2097-2098, Oct. 24, 1996.
English language abstract of JP 2000-031060, published Jan. 28, 2000.
English language abstract of JP 08-078338, published Mar. 22, 1996.
English language abstract of JP 04-186825, published Jul. 3, 1992.
English language abstract of JP 04-274317, published Sep. 30, 1992.
English language abstract of JP 07-029827, published Jan. 31, 1995.
English language abstract of JP 02-308536, published Dec. 21, 1980.
English language abstract of JP 11-150111, published Jun. 2, 1999.
English language abstract of JP 05-013756, published Jan. 22, 1993.
English language abstract of JP 62-237729, published Oct. 17, 1987.
English language abstract of JP 63-204616, published Aug. 24, 1988.
English language abstract of JP 62-027573, published Feb. 5, 1987.
Office Action issued in U.S. Appl. No. 10/333,406, mailed Aug. 18, 2004.
Office Action issued in U.S. Appl. No. 10/333,406, mailed Nov. 24, 2004.
Office Action issued in U.S. Appl. No. 10/333,406, mailed May 20, 2005.
Office Action issued in U.S. Appl. No. 10/333,406, mailed Nov. 25, 2005.
Office Action issued in U.S. Appl. No. 10/333,406, mailed Nov. 15, 2006.
Office Action issued in U.S. Appl. No. 11/231,336 mailed Sep. 4, 2008.
Final Office Action issued in U.S. Appl. No. 11/231,335 mailed Sep. 16, 2008.
International Search Report, Application PCT/US06/027655, mailed Jun. 3, 2008.
Written Opinion issued in Application No. PCT/US06/027655, mailed Jun. 3, 2008.
Notice of Allowance issued in Application No. 11/093,260 mailed Oct. 31, 2008.
Taiwanese Office Action issued in Application No. 95109788 mailed Nov. 10, 2008.
English language translation of the Taiwanese Office Action issued in Application No. 95109788 mailed Nov. 10, 2008.
International Search Report issued in counterpart International Application No. PCT/US06/05420, dated Aug. 29, 2007.
International Preliminary Report on Patentability issued in counterpart International Application No. PCT/US06/05420, dated Oct. 25, 2007.
Office Action issued in U.S. Appl. No. 11/093,261, mailed Dec. 22, 2008.
Chinese Office Action issued in Chinese Patent Application No. 200680010882.3, mailed Oct. 31, 2008.
English translation of Chinese Office Action issued in Chinese Patent Application No. 200680010882.3, mailed Oct. 31, 2008.
Chinese Office Action issued in Chinese Patent Application No. 200680010825.5, mailed Nov. 7, 2008.
English translation of Chinese Office Action issued in Chinese Patent Application No. 200680010825.5, mailed Nov. 7, 2008.

* cited by examiner

METHOD AND SYSTEM FOR FORMING AN OXYNITRIDE LAYER BY PERFORMING OXIDATION AND NITRIDATION CONCURRENTLY

BACKGROUND OF THE INVENTION

Field of the Invention

The present invention generally relates to methods and systems suitable for producing electric devices and materials used for electronic devices.

BRIEF SUMMARY OF THE INVENTION

The invention generally relates to a method for preparing an oxynitride film on a substrate. An oxynitride film is formed by exposing a surface of said substrate to oxygen radicals and nitrogen radicals. The oxygen and nitrogen radicals are formed by plasma induced dissociation of a process gas comprising nitrogen and oxygen using plasma based on microwave irradiation via a plane antenna member having a plurality of slits.

DETAILED DESCRIPTION OF SEVERAL EMBODIMENTS

SPA O2/N2 Oxynitridation

Figure 1:
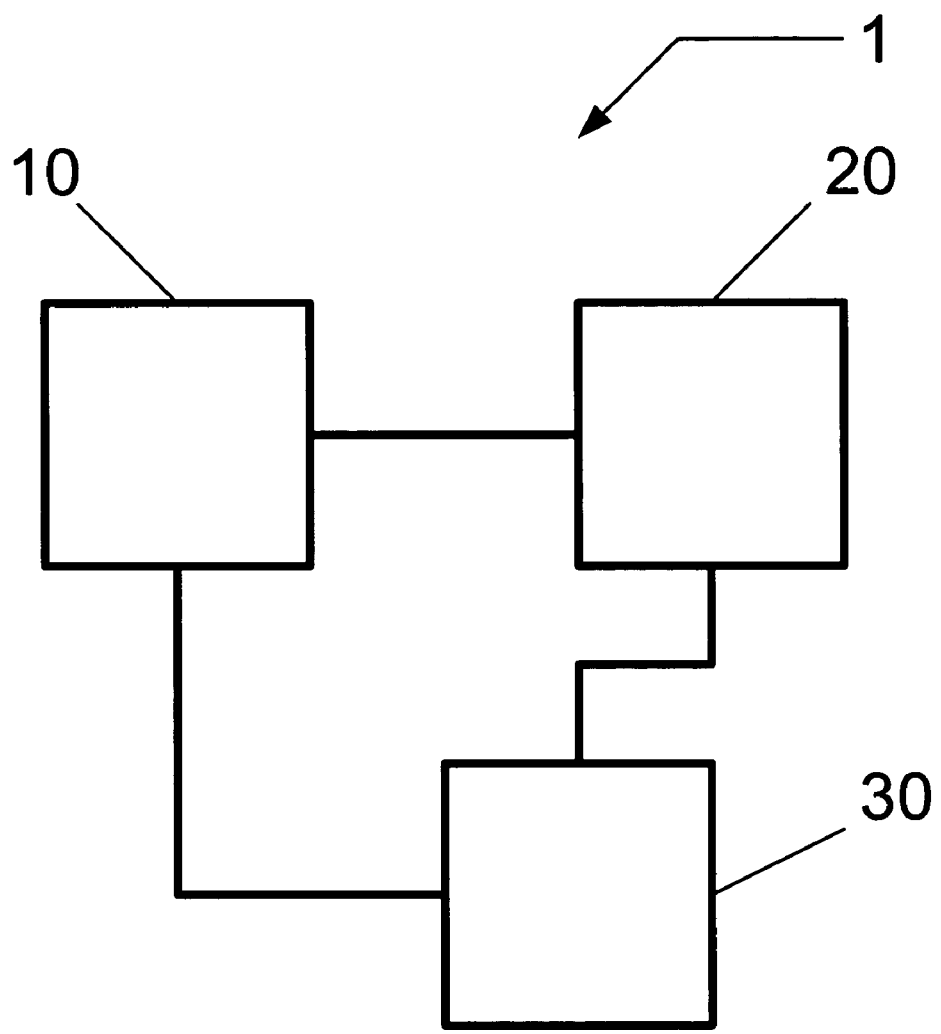
FIG. 1 illustrates one embodiment of a treatment system 1 for forming an oxynitride layer on a substrate.

FIG. 1 illustrates a treatment system 1 for forming an oxynitride layer on a substrate. For example, the substrate can comprise a silicon substrate and the oxynitride layer can comprise a silicon oxynitride layer formed via oxidation and nitridation of the substrate. The substrate surface can be a silicon surface, an oxide surface, or a silicon oxide surface. The treatment system 1 comprises an oxynitridation system 10 configured to introduce oxygen and nitrogen concurrently to the substrate, and an oxidation and/or nitridation system 20 configured to introduce oxygen and/or nitrogen to the substrate. Additionally, treatment system 1 further comprises a controller 30 coupled to the oxynitridation system 10 and the oxidation and/or nitridation system 20, and configured to perform at least one of monitoring, adjusting, or controlling the process(es) performed in the oxynitridation system 10 and the oxidation and/or nitridation system 20. Although the oxynitridation system 10 and the oxidation and/or nitridation system 20 are illustrated as separate modules in FIG. 1, they may comprise the same module.

Figure 2:
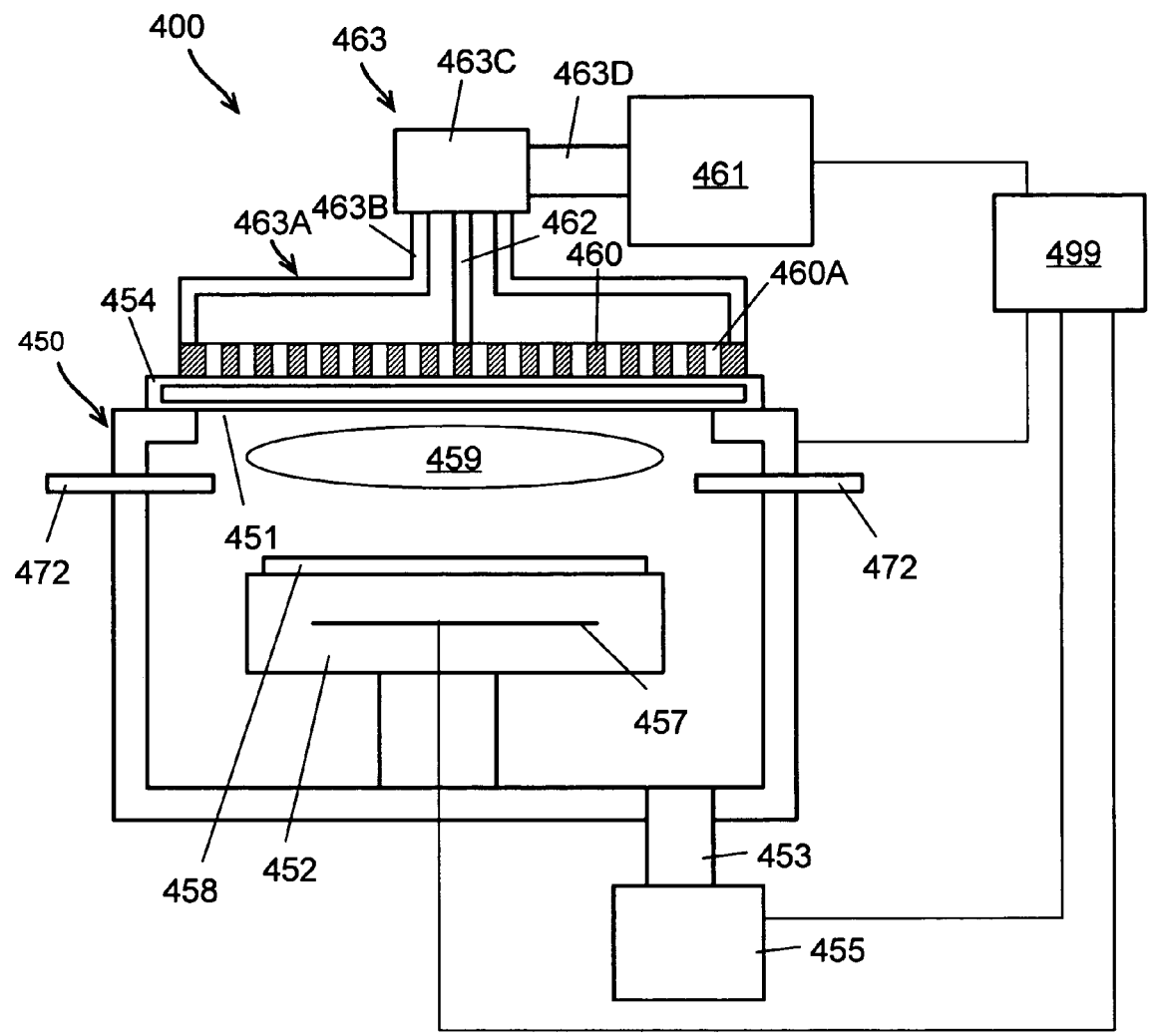
FIG. 2 illustrates one embodiment of a plasma processing system containing a slot plane antenna (SPA) plasma source for processing a gate stack.

FIG. 2 is a simplified block-diagram of a plasma processing system containing a slot plane antenna (SPA) plasma source for the oxynitridation process according to an embodiment of the invention. The plasma produced in the plasma processing system 400 is characterized by low electron temperature (less than about 1.5 eV) and high plasma density (e.g., >about $1\times10^{12}/cm^3$), that enables damage-free processing of gate stacks according to the invention. The plasma processing system 400 can, for example, be a TRIAS™ SPA processing system from Tokyo Electron Limited, Akasaka, Japan. The plasma processing system 400 contains a process chamber 450 having an opening portion 451 in the upper portion of the process chamber 450 that is larger than a substrate 125. A cylindrical dielectric top plate 454 made of quartz or aluminum nitride is provided to cover the opening portion 451. Gas lines 472 are located in the side wall of the upper portion of process chamber 450 below the top plate 454. In one example, the number of gas lines 472 can be 16 (only two are which are shown in FIG. 2). Alternately, a different number of gas feed lines 472 can be used. The gas lines 472 can be circumferentially arranged in the process chamber 450, but this is not required for the invention. A process gas can be evenly and uniformly supplied into the plasma region 459 in process chamber 450 from the gas lines 472. Alternatively, a feed line 472 on the upstream side of the substrate relative to the exhaust may be configured as a remote RF plasma source suitable for oxidation or nitridation.

In the plasma processing system 450, microwave power is provided to the process chamber 450 through the top plate 454 via a plane antenna member 460 having a plurality of slots 460A. The slot plane antenna 460 can be made from a metal plate, for example copper. In order to supply the microwave power to the slot plane antenna 460, a waveguide 463 is disposed on the top plate 454, where the waveguide 463 is connected to a microwave power supply 461 for generating microwaves with a frequency of about 2.45 GHz, for example. The waveguide 463 contains a flat circular waveguide 463A with a lower end connected to the slot plane antenna 460, a circular waveguide 463B connected to the upper surface side of the circular waveguide 463A, and a coaxial waveguide converter 463C connected to the upper surface side of the circular waveguide 463B. Furthermore, a rectangular waveguide 463D is connected to the side surface of the coaxial waveguide converter 463C and the microwave power supply 461.

Inside the circular waveguide 463B, an axial portion 462 of an electroconductive material is coaxially provided, so that one end of the axial portion 462 is connected to the central (or nearly central) portion of the upper surface of slot plane antenna 460, and the other end of the axial portion 462 is connected to the upper surface of the circular waveguide 463B, thereby forming a coaxial structure. As a result, the circular waveguide 463B is constituted so as to function as a coaxial waveguide. The microwave power can, for example, be between about 0.5 W/cm$^2$ and about 4 W/cm$^2$. Alternately, the microwave power can be between about 0.5 W/cm$^2$ and about 3 W/cm$^2$.

In addition, in the vacuum process chamber 450, a substrate holder 452 is provided opposite the top plate 454 for supporting and heating a substrate 125 (e.g., a wafer). The substrate holder 452 contains a heater 457 to heat the substrate 125, where the heater 457 can be a resistive heater. Alternately, the heater 457 may be a lamp heater or any other type of heater. Furthermore the process chamber 450 contains an exhaust line 453 connected to the bottom portion of the process chamber 450 and to a vacuum pump 455.

The substrate holder 452 can be rotated by a drive mechanism (not shown). As before, the substrate can be rotated the substrate in the plane of the substrate surface at a rate of about 1 rpm to about 60 rpm, which includes 1, 2, 3, 4, 5, 6, 7, 8, 9, 10, 11, 12, 13, 14, 15, 16, 17, 18, 19, 20, 30, 40, 50, or 60 rpm, or any combination thereof.

Prior to oxynitriding, it may be desirable to clean the substrate surface, or remove a native oxide from the substrate surface. This may be accomplished using one or more cleaning steps including wet chemical cleaning, or forming a bare silicon surface on the substrate surface by cleaning followed by contacting the substrate surface with HF, or both.

For oxynitridation, a gas containing a molecular composition having nitrogen and oxygen may be introduced into process chamber 450. Any nitrogen and oxygen containing composition is suitable, e.g., any of $N_2$, NO, $N_2O$, $NO_2$, or $O_2$, alone or in combination. In one embodiment, the molecular composition in the oxynitriding process gas may include $O_2$, $N_2$ and optionally at least one second gas selected from the group consisting of $H_2$, Ar, He, Ne, Xe, or Kr, or any combination thereof. In one embodiment, the molecular composition in the process gas comprises $O_2$, $N_2$ and $H_2$ and optionally at least one second gas selected from the group consisting of Ar, He, Ne, Xe, or Kr, or any combination thereof. Once introduced, the oxygen and nitrogen containing composition is dissociated via microwave radiation plasma induced dissociation based on microwave irradiation via a plane antenna having a plurality of slits. Additional nitridation or annealing may be effected by dissociation of nitrogen by an RF plasma source located upstream of the substrate via the coupling of RF power to the nitrogen containing composition.

Oxynitridation may be suitably accomplished using a microwave induced plasma via slot plane antenna microwave source, such as shown in FIG. 2. In this embodiment, the oxygen and nitrogen containing molecular composition or compositions is dissociated by microwave induced plasma, which has a low electron temperature and high plasma density.

The oxynitride film obtained may have a thickness of about 0.1 nm to about 5 nm, which range includes 0.1, 0.2, 0.3, 0.4, 0.5, 0.6, 0.7, 0,8, 0.9, 1, 1.1, 1.2, 1.3, 1.4, 1.5, 1.6, 1.7, 1.8, 1.9, 2, 2.1, 2.3, 2.4, 2.5, 2.6, 2.7, 2.8, 2.9, 3.0, 3.1, 3.2, 3.3., 3.4, 3.5, 3.6, 3.8, 4, 4.1, 4.5, or 5 nm, or any combination thereof. The oxynitride film may have a thickness variation σ of about 0.7% to about 4%, which includes 0.7, 0.9, 1, 2, 3, or 4%.

The oxynitriding may be carried out at a substrate temperature of about 20° C. to about 1000° C., which range includes 20, 30, 40, 50, 60, 70, 80, 90, 100, 125, 150, 175, 200, 225, 250, 275, 300, 325, 350, 375, 400, 450, 500, 550, 600, 650, 700, 750, 800, 850, 900, 950, or 1000° C., or any combination thereof.

The oxynitriding may be carried out at a pressure of about 1 mTorr to about 30,000 mTorr, which includes 1, 2, 3, 4, 5, 6, 7, 8, 9, 10, 20, 30, 40, 50, 60, 70, 80, 90, 100, 250, 500, 750, 1,000, 10,000, 20,000, or 30,000 mTorr, or any combination thereof.

The flow rate of the oxygen and nitrogen containing molecular composition O2 and/or N2 may range from 2 sccm to 5 slm, and that of the second gas may be about 100 sccm to about 5 slm. These ranges include 2, 3, 4, 5, 6, 7, 8, 9, 10, 20, 30, 35, 40, 45, 50, 55, 60, 65, 70, 75, 80, 85, 90, 100, 250, 275, 300, 400, 500, 600, 700, 800, 900, or 1000 (sccm), 2, 3, 4, or 5 (slm), or any combination thereof.

The oxynitriding may be carried out for a time of about 5 seconds to about 25 minutes, which range includes 5, 10, 15, 20, 25, 30, 35, 40, 50, 60 (seconds), 2, 3, 4, 5, 6, 7, 8, 9, 10, 15, 20, or 25 (minutes), or any combination thereof. The time may suitably be from 20 sec to 5 minutes.

The oxynitride film may have a surface nitrogen concentration of about 20% or less, which includes 4, 6, 8, 10, 12, 14, 16, 18, and 20% or less.

The oxynitriding plasma may be generated by a microwave output of about 0.5 W/cm2 to about 5 W/cm2, which includes 0.5, 0.6, 0.7, 0.8, 0.9, 1, 1.1, 1.3, 1.5, 1.7, 1.9, 2, 3, 4, or 5 W/cm2, or any combination thereof.

The microwave irradiation may comprise a microwave frequency of about 300 MHz to about 10 GHz, which includes 300, 400, 500, 600, 700, 800, 900, or 1000 (MHz), 1.5, 2, 3, 4, 5, 6, 7, 8, 9, or 10 (GHz).

In this embodiment, the plasma may comprise an electron temperature of less than about 3 eV, which includes 0.1, 0.3, 0.5, 0.7, 0.9, 1, 1.5, 2, 2.5, or 3 eV, or any combination thereof. The plasma may have a density of about 1×1011/cm3 to about 1×1013/cm3 or higher, and a density uniformity of about ±3% or less, which includes ±1, ±2, and ±3%.

The plane antenna member may have a surface area on a surface thereof greater than the area of the substrate surface on which the film is deposited.

The oxynitride film may suitably have the formula SiON.

Still referring to FIG. 2, a controller 499 includes a microprocessor, a memory, and a digital I/O port capable of generating control voltages sufficient to communicate and activate inputs of the plasma processing system 400 as well as monitor outputs from the plasma processing system 400. Moreover, the controller 499 is coupled to and exchanges information with process chamber 450, the pump 455, the heater 457, and the microwave power supply 461. A program stored in the memory is utilized to control the aforementioned components of plasma processing system 400 according to a stored process recipe. One example of processing system controller 499 is a UNIX-based workstation. Alternately, the controller 499 can be implemented as a general-purpose computer, digital signal processing system, etc.

The controller 499 may be locally located relative to the plasma processing system 400 or it may be remotely located relative to the plasma processing system 400 via an internet or intranet. Thus, the controller 499 can exchange data with the plasma processing system 99 using at least one of a direct connection, an intranet, or the internet. The controller 499 may be coupled to an intranet at a customer site (i.e., a device maker, etc.), or coupled to an intranet at a vendor site (i.e., an equipment manufacturer). Furthermore, another computer (i.e., controller, server, etc.) can access the controller 499 to exchange data via at least one of a direct connection, an intranet, or the internet.

As an alternative to the process parameters set forth above, the following parameters can be employed:

SPA

| Parameter | Typical | Low | High |
| --- | --- | --- | --- |
| Pressure | 75 mTorr | 10 mTorr | 10 Torr |
| Temperature | 400° C. | 25° C. | 1000° C. |
| Gas Ar | 1 slm | 500 sccm | 10 slm |
| Gas $N_2$ | 40 sccm | 5 sccm | 1 slm |
| Gas $O_2$ | 100 sccm | 10 sccm | 1 slm |
| Gas $H_2$ | 10 sccm | 0 | 1 slm |
| Time | 20 sec | 5 sec | 5 min |

Other suitable plasma processing systems containing a slot plane antenna plasma source and methods of using are described in European Patent Application EP 1361605 A1, filed Jan. 22, 2002, the entire contents of which are hereby incorporated by reference.

RFN Nitriding

RFN nitriding and/or annealing may be employed concurrently with or after the SPA oxynitriding process. In RFN nitriding, the oxynitride film may be exposed to nitrogen radicals formed by an upstream plasma induced dissociation of an upstream process gas comprising an upstream molecular composition comprising nitrogen, and wherein said upstream plasma induced dissociation comprises using plasma generated via the coupling of radio frequency (RF) power to said upstream process gas.

Figure 4:
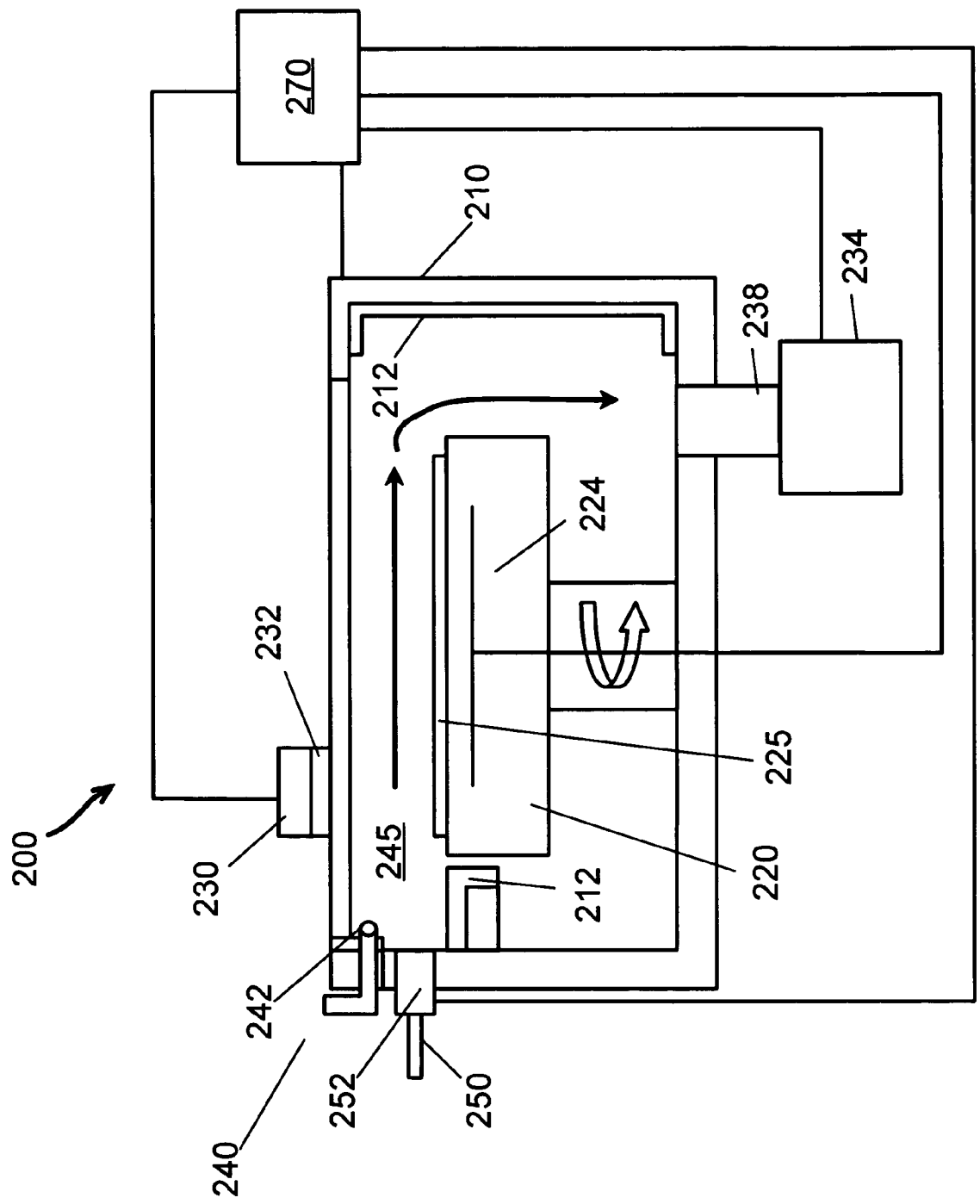
FIG. 4 illustrates one embodiment of an alternative processing system.

RFN remote plasma systems are illustrated in FIGS. 2 and 4. The processing system illustrated in FIG. 4 includes a remote plasma source 252 with a gas inlet 250, which is suitable for generating plasma remotely and upstream of substrate 225. Nitrogen plasma produced in remote plasma source 252 is caused to flow downstream and over the surface of substrate 225 to the exhaust line 238 and pump 234. The substrate can be rotated (as shown by the circular arrow) in the process system of FIG. 4. In this way, uniformity in nitridation, oxynitridation, or annealing under nitrogen is improved.

Alternatively, a remote RF plasma source may be provided in feed line 472 connected to the process chamber 450 in FIG. 2 on an upstream side of the substrate 458 relative to the exhaust, and would be suitable as a remote RF plasma source for nitridation.

An example of some process parameters for RFN nitriding is given below:

RFN

| Parameter | Typical | Low | High |
| --- | --- | --- | --- |
| Pressure | 200 mTorr | 10 mTorr | 10 Torr |
| Temperature | 400° C. | 25° C. | 1000° C. |
| Gas Ar | 1 slm | 500 sccm | 10 slm |
| Gas $N_2$ | 100 sccm | 10 sccm | 1 slm |
| Time | 60 sec | 5 sec | 5 min |

$UVO_2$ Oxidation

Figure 3:
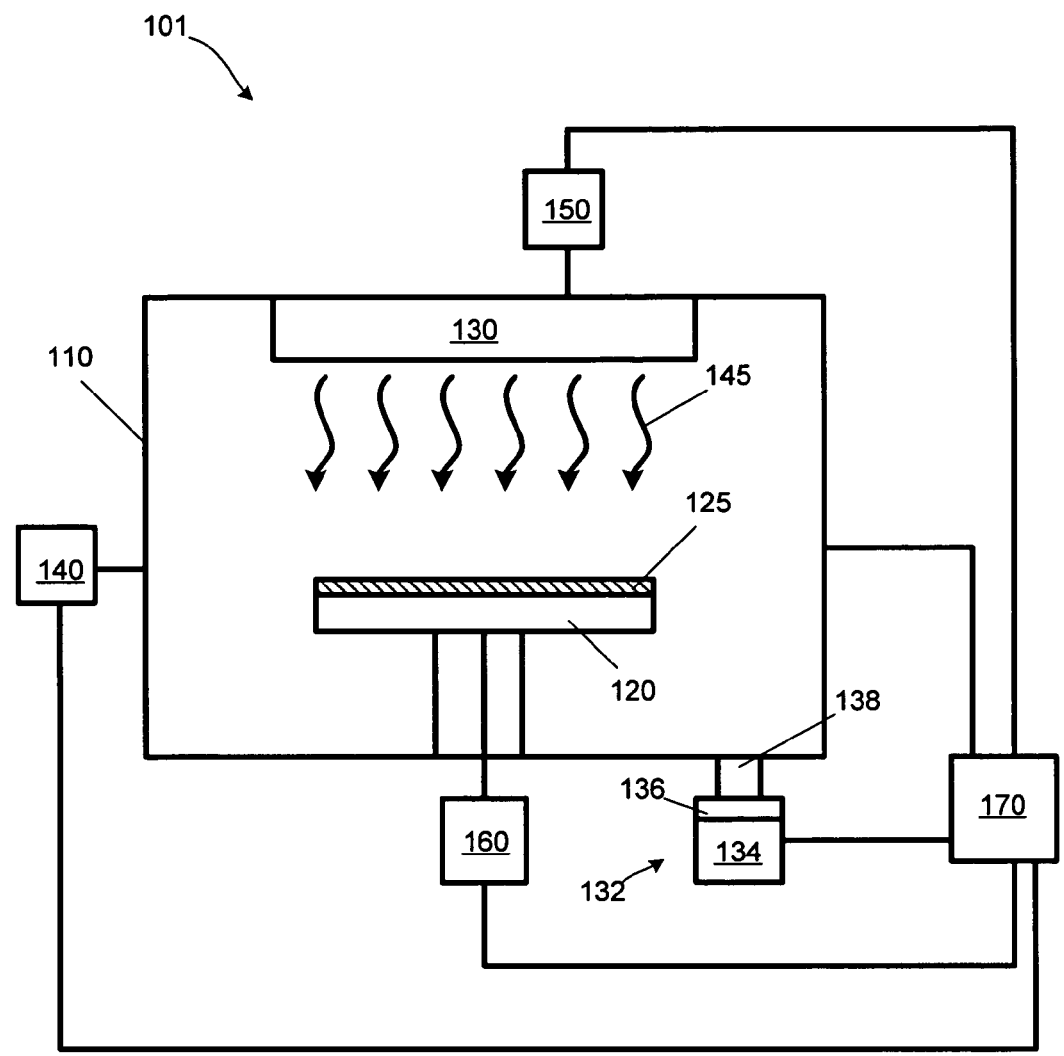
FIG. 3 illustrates one embodiment of schematic diagram of a processing system for performing an oxidation process.

According to one embodiment, FIG. 3 presents a schematic diagram of a processing system for performing an oxidation process, should one be necessary before or after oxinitridation as described above. The processing system 101 comprises a process chamber 110 having a substrate holder 120 configured to support a substrate 125 having a silicon (Si) surface. The process chamber 110 further contains an electromagnetic radiation assembly 130 for exposing the substrate 125 to electromagnetic radiation. Additionally, the processing system 101 contains a power source 150 coupled to the electromagnetic radiation assembly 130, and a substrate temperature control system 160 coupled to substrate holder 120 and configured to elevate and control the temperature of substrate 125. A gas supply system 140 is coupled to the process chamber 110, and configured to introduce a process gas to process chamber 110. For example, in an oxidation process, the process gas can include an oxygen containing gas, such as, for example, $O_2$, NO, $NO_2$ or $N_2O$. The process gas can be introduced at a flow rate of about 30 sccm to about 5 slm, which includes 30, 35, 40, 45, 50, 55, 60, 65, 70, 75, 80, 85, 90, 100, 250, 275, 300, 400, 500, 600, 700, 800, 900, or 1000 (sccm), 2, 3, 4, or 5 (slm), or any combination thereof. Additionally (not shown), a purge gas can be introduced to process chamber 110. The purge gas may comprise an inert gas, such nitrogen or a noble gas (i.e., helium, neon, argon, xenon, krypton). The flow rate of the purge gas can be about 0 slm to about 5 slm, which includes 0, 1, 2, 3, 4, 5, 6, 7, 8, 9, 10, 20, 30, 35, 40, 45, 50, 55, 60, 65, 70, 75, 80, 85, 90, 100, 250, 275, 300, 400, 500, 600, 700, 800, 900, or 1000 (sccm), 2, 3, 4, or 5 (slm), or any combination thereof.

The electromagnetic radiation assembly 130 can, for example, comprise an ultraviolet (UV) radiation source. The UV source may be monochromatic or polychromatic. Additionally, the UV source can be configured to produce radiation at a wavelength sufficient for dissociating the process gas, i.e., $O_2$. In one embodiment, the ultraviolet radiation can have a wavelength from about 145 nm to about 192 nm, which includes 145, 147, 150, 155, 171, 172, 173, 175, 180, 185, 190, and 192 nm as appropriate for the binding energy of the molecule which is dissociated. The electromagnetic radiation assembly 130 can operate at a power of about 5 $W/cm^2$ to about 50 $mW/cm^2$, which includes 5, 6, 7, 8, 9, 10, 11, 13, 15, 17, 19, 20, 30, 40, 50 $mW/cm^2$, or any combination thereof. The electromagnetic radiation assembly 130 can include one, two, three, four, or more radiation sources. The sources can include lamps or lasers or a combination thereof.

Referring still to FIG. 3, the processing system 101 may be configured to process 200 mm substrates, 300 mm substrates, or larger-sized substrates. In fact, it is contemplated that the processing system may be configured to process substrates, wafers, or LCDs regardless of their size, as would be appreciated by those skilled in the art. Therefore, while aspects of the invention will be described in connection with the processing of a semiconductor substrate, the invention is not limited solely thereto.

Referring again to FIG. 3, processing system 101 comprises substrate temperature control system 160 coupled to the substrate holder 120 and configured to elevate and control the temperature of substrate 125. Substrate temperature control system 160 comprises temperature control elements, such as a heating system that may comprise resistive heating elements, or thermo-electric heaters/coolers. Additionally, substrate temperature control system 160 may comprise a cooling system including a re-circulating coolant flow that receives heat from substrate holder 120 and transfers heat to a heat exchanger system (not shown), or when heating, transfers heat from the heat exchanger system. Furthermore, the substrate temperature control system 160 may include temperature control elements disposed in the chamber wall of the process chamber 110 and any other component within the processing system 101.

In order to improve the thermal transfer between substrate 125 and substrate holder 120, the substrate holder 120 can include a mechanical clamping system, or an electrical clamping system, such as an electrostatic clamping system, to affix substrate 125 to an upper surface of substrate holder 120. Furthermore, substrate holder 120 can further include a substrate backside gas delivery system configured to introduce gas to the back-side of substrate 125 in order to improve the gas-gap thermal conductance between substrate 125 and substrate holder 120. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 125.

Furthermore, the process chamber 110 is further coupled to a pressure control system 132, including a vacuum pumping system 134 and a valve 136, through a duct 138, wherein the pressure control system 134 is configured to controllably evacuate the process chamber 110 to a pressure suitable for forming the thin film on substrate 125, and suitable for use of the first and second process materials.

The vacuum pumping system 134 can include a turbo-molecular vacuum pump (TMP) capable of a pumping speed up to about 5000 liters per second (and greater) and valve 136 can include a gate valve for throttling the chamber pressure. In conventional plasma processing devices, a about 500 to about 3000 liter per second TMP is generally employed. Moreover, a device for monitoring chamber pressure (not shown) can be coupled to the processing chamber 10. The pressure measuring device can be, for example, a Type 628B Baratron absolute capacitance manometer commercially available from MKS Instruments, Inc. (Andover, Mass.).

Additionally, the processing system 101 contains a controller 170 coupled to the process chamber 110, substrate holder 120, electromagnetic radiation assembly 130, power source 150, and substrate temperature control system 160. Alternately, or in addition, controller 170 can be coupled to a one or more additional controllers/computers (not shown), and controller 70 can obtain setup and/or configuration information from an additional controller/computer.

In FIG. 3, singular processing elements (110, 120, 130, 150, 160, and 170) are shown, but this is not required for the invention. The processing system 1 can comprise any number of processing elements having any number of controllers associated with them in addition to independent processing elements.

The controller 170 can be used to configure any number of processing elements (110, 120, 130, 150, and 160), and the controller 170 can collect, provide, process, store, and display data from processing elements. The controller 170 can comprise a number of applications for controlling one or more of the processing elements. For example, controller 170 can include a graphic user interface (GUI) component (not shown) that can provide easy to use interfaces that enable a user to monitor and/or control one or more processing elements.

Still referring to FIG. 3, controller 170 can comprise a microprocessor, memory, and a digital I/O port capable of generating control voltages sufficient to communicate and activate inputs to processing system 101 as well as monitor outputs from processing system 101. For example, a program stored in the memory may be utilized to activate the inputs to the aforementioned components of the processing system 101 according to a process recipe in order to perform process. One example of the controller 170 is a DELL PRECISION WORKSTATION 610™, available from Dell Corporation, Austin, Tex.

The controller 170 may be locally located relative to the processing system 1, or it may be remotely located relative to the processing system 101. For example, the controller 170 may exchange data with the deposition 101 using at least one of a direct connection, an intranet, the Internet and a wireless connection. The controller 170 may be coupled to an intranet at, for example, a customer site (i.e., a device maker, etc.), or it may be coupled to an intranet at, for example, a vendor site (i.e., an equipment manufacturer). Additionally, for example, the controller 160 may be coupled to the Internet. Furthermore, another computer (i.e., controller, server, etc.) may access, for example, the controller 170 to exchange data via at least one of a direct connection, an intranet, and the Internet. As also would be appreciated by those skilled in the art, the controller 170 may exchange data with the processing system 101 via a wireless connection.

The processing conditions can further include a substrate temperature between about 0° C. and about 1000° C. Alternately, the substrate temperature can be between about 200° C. and about 700° C. Thus, the oxidizing can be carried out at a substrate temperature of 200, 225, 250, 275, 300, 325, 350, 375, 400, 450, 500, 550, 600, 650, 700, 750, 800, 850, 900, 950, or 1000° C., or any combination thereof.

The pressure in the process chamber 10 can, for example, be maintained between about 1 mTorr and about 30,000 mTorr. Alternately, the pressure can be maintained between about 20 mTorr and about 1000 mTorr. Yet alternately, the pressure can be maintained between about 50 mTorr and about 500 mTorr. Thus, the oxynitriding may be carried out at a pressure of about 1 mTorr to about 30,000 mTorr, which includes 1, 2, 3, 4, 5, 6, 7, 8, 9, 10, 20, 30, 40, 50, 60, 70, 80, 90, 100, 250, 500, 750, 1,000, 10,000, 20,000, or 30,000 mTorr, or any combination thereof.

FIG. 4 is a schematic diagram of a processing system for oxidation or nitridation according to another embodiment. The processing system 200 includes a process chamber 210 accommodating therein a substrate holder 220 equipped with a heater 224 that can be a resistive heater configured to elevate the temperature of substrate 125. Alternately, the heater 224 may be a lamp heater or any other type of heater. Furthermore the process chamber 210 contains an exhaust line 238 connected to the bottom portion of the process chamber 210 and to a vacuum pump 234. The substrate holder 220 can be rotated by a drive mechanism (not shown). As before, the substrate can be rotated the substrate in the plane of the substrate surface at a rate of about 1 rpm to about 60 rpm, which includes 1, 2, 3, 4, 5, 6, 7, 8, 9, 10, 11, 12, 13, 14, 15, 16, 17, 18, 19, 20, 30, 40, 50, or 60 rpm, or any combination thereof.

The process chamber 210 contains a process space 245 above the substrate 125. The inner surface of the process chamber 210 contains an inner liner 212 made of quartz in order to suppress metal contamination of the substrate 125 to be processed.

The process chamber 210 contains a gas line 240 with a nozzle 242 located opposite the exhaust line 238 for flowing a process gas over the substrate 125. The process gas crosses the substrate 125 in a processing space 245 in a laminar flow and is evacuated from the process chamber 210 by the exhaust line 238. A remote plasma source 252 is connected, with a gas inlet 250 suitable for generating a plasma remotely and upstream of the substrate 125.

In one example, the substrate 125 may be exposed to ultraviolet radiation from an ultraviolet radiation source 230 emitting light through a quartz window 232 into the processing space 245 between the nozzle 242 and the substrate 125. Alternately, the ultraviolet radiation source 230 and quartz window 232 can cover the whole substrate 125.

Still referring to FIG. 4, a controller 270 includes a microprocessor, a memory, and a digital I/O port capable of generating control voltages sufficient to communicate and activate inputs of the processing system 200 as well as monitor outputs from the plasma processing system 200. Moreover, the controller 270 is coupled to and exchanges information with process chamber 210, the pump 234, the heater 224, and the ultraviolet radiation source 230. The controller 270 may be implemented as a UNIX-based workstation. Alternatively, the controller 270 can be implemented as a general-purpose computer, digital signal processing system, etc.

To perform oxidation using the apparatus of FIG. 3 or FIG. 4, substrate 125 is placed on substrate holder 120 (FIG. 3) or 220 (FIG. 4). Conditions in process chamber 110 or 210 (pressure, temperature, substrate rotation, etc.) are then brought to the desired values. Accordingly, an oxygen containing molecular composition is introduced into process chamber 110 or 210 via gas supply system 140 or nozzle 242. Electromagnetic radiation assembly 130 or 230 is energized to form oxygen radicals from the process gas. In the embodiment of FIG. 4, the population of oxygen radicals can be enhanced by supplying an oxygen containing molecular composition to inlet 250. Oxygen radicals are produced as the gas passes through remote plasma source 252 and are then introduced into process chamber 210.

Prior to oxynitridation, the oxygen radicals associate with the surface of substrate 125 to oxidize the surface of the substrate. The composition of the surface can be SiO2.

The oxidizing may be carried out for a time of about 5 seconds to about 25 minutes, which includes 5, 10, 15, 20, 25, 30, 35, 40, 50, 60 (seconds), 2, 3, 4, 5, 6, 7, 8, 9, 10, 15, 20, or 25 (minutes), or any combination thereof.

The oxide film can have a thickness of about 0.1 nm to about 3 nm, which range includes 0.1, 0.2, 0.3, 0.4, 0.5, 0.6, 0.7, 0,8, 0.9, 1, 1.1, 1.2, 1.3, 1.4, 1.5, 1.6, 1.7, 1.8, 1.9, 2, 2.1, 2.3, 2.4, 2.5, 2.6, 2.7, 2.8, 2.9, or 3.0 nm. The oxide film may have a thickness variation σ of about 0.7% to about 4%, which includes 0.7, 0.9, 1, 2, 3, or 4%.

Any of the process conditions or features mentioned above with regard to the embodiment of either FIG. 1, FIG. 2, FIG. 3 or FIG. 4 may also be applied to the any other embodiment. Indeed, as an alternative to the conditions discussed above, the following conditions may be employed as appropriate:

$UVO_2$

| Parameter | Typical | Low | High |
|---|---|---|---|
| Pressure | 0.1 Torr | 0.01 Torr | 20 Torr |
| Temperature | 700° C. | 400° C. | 800° C. |
| Gas Ar | 0 | 0 | 2 slm |
| Gas $O_2$ | 450 sccm | 100 sccm | 2 slm |
| Time | 60 sec | 10 sec | 5 min |

Other suitable processing systems containing an ultraviolet (UV) radiation source and methods of using are described in European Patent Application EP 1453083 A1, filed Dec. 5, 2002, the entire contents of which are hereby incorporated by reference.

LP Annealing

After the subject film is prepared, e.g., the oxynitrided film, it may be annealed. The LP anneal suitably anneals the oxynitride film.

The LP annealing may be carried out at a pressure of about 5 mTorr to about 800 Torr, which includes 5, 6, 7, 8, 9, 10, 20, 30, 40, 50, 60, 70, 80, 90, 100, 250, 500, 750, 1,000, 10,000, 20,000, 30,000, 50,000, 100,000, 200,000, 400,000, or 800,000 mTorr, or any combination thereof.

The LP annealing may be carried out at a temperature of about 500° C. to about 1200° C., which includes 500, 550, 600, 650, 700, 750, 800, 850, 900, 950, 1000, 1100, or 1200° C., or any combination thereof.

The LP annealing may be carried out under an annealing gas comprising at least one molecular composition comprising oxygen, nitrogen, $H_2$, Ar, He, Ne, Xe, or Kr, or any combination thereof at a flow rate of 0 to 20 slm. In one embodiment, LP annealing is effected under $N_2$ at an $N_2$ flow rate of about 0 slm to about 20 slm, which includes 2, 3, 4, 5, 6, 7, 8, 9, 10, 20, 30, 35, 40, 45, 50, 55, 60, 65, 70, 75, 80, 85, 90, 100, 250, 275, 300, 400, 500, 600, 700, 800, 900, or 1000 (sccm), 2, 3, 4, 5, 10, 15, or 20 (slm), or any combination thereof.

The LP annealing may be carried out for a time of about 1 second to about 10 minutes, which range includes 1, 2, 3, 4, 5, 6, 7, 8, 9, 10, 15, 20, 25, 30, 35, 40, 50, 60 (seconds), 2, 3, 4, 5, 6, 7, 8, 9, or 10 (minutes), or any combination thereof.

The LP annealing and the nitriding may be carried out in the same process chamber, in which case it is possible to carry out at least one purging step is carried out after the nitriding and prior to the annealing. Of course, it is also possible to carry out nitriding and the annealing in different process chambers. In this embodiment, it is possible to transfer the film-bearing substrate from one chamber to another without contacting ambient atmosphere, air, etc.

Alternatively, the following conditions may be employed for an anneal:

LP Anneal

| Parameter | Typical | Low | High |
|---|---|---|---|
| Pressure | 1 Torr | 50 mTorr | 760 Torr |
| Temperature | 1000° C. | 800° C. | 1100° C. |
| Gas N2 | 1 slm | 0 | 10 slm |
| Gas O2 | 1 slm | 0 | 10 slm |
| Time | 15 sec | 5 sec | 5 min |

$UVO_2/N_2$ Post Anneal

The $UVO_2/N_2$ post anneal alternatively suitably anneals the oxynitride film by exposing the film to oxygen radicals and nitrogen radicals formed by ultraviolet (UV) radiation induced dissociation of an annealing gas comprising at least one molecular composition comprising oxygen and nitrogen.

The UVO2/N2 Post Anneal suitably anneals the oxynitride film by exposing said oxynitride film to oxygen radicals and nitrogen radicals formed by ultraviolet (UV) radiation induced dissociation of an annealing gas comprising at least one molecular composition comprising oxygen and nitrogen. The oxygen and nitrogen radicals are dissociated from an annealing gas comprising at least one molecular composition comprising oxygen and nitrogen selected from the group consisting of $O_2$, $N_2$, NO, $NO_2$, and $N_2O$, or any combination thereof. Other gases may be present for example one or more of $H_2$, Ar, He, Ne, Xe, or Kr, or any combination thereof.

In one embodiment of this anneal, the annealing gas flows across the oxynitride surface such that the oxygen and nitrogen radicals are comprised within a laminar flow of the annealing gas across the surface.

The annealing may be carried out at a pressure of about 1 mTorr to about 80,000 mTorr, which includes 1, 2, 3, 4, 5, 6, 7, 8, 9, 10, 20, 30, 40, 50, 60, 70, 80, 90, 100, 250, 500, 750, 1,000, 10,000, 20,000, 30,000, 50,000, 100,000, 200,000, 400,000, or 800,000 mTorr, or any combination thereof.

The annealing may be carried out at a temperature of about 400° C. to about 1200° C., which includes 500, 550, 600, 650, 700, 750, 800, 850, 900, 950, 1000, 1100, or 1200° C., or any combination thereof.

The annealing gas may have a flow rate of about 0 slm to about 20 slm, which includes 0, 1, 2, 3, 4, 5, 6, 7, 8, 9, 10, 20, 30, 35, 40, 45, 50, 55, 60, 65, 70, 75, 80, 85, 90, 100, 250, 275, 300, 400, 500, 600, 700, 800, 900, or 1000 (sccm), 2, 3, 4, 5, 10, 15, or 20 (slm), or any combination thereof.

The annealing may be carried out for a time of about 1 second to about 10 minutes, which range includes 1, 2, 3, 4, 5, 6, 7, 8, 9, 10, 15, 20, 25, 30, 35, 40, 50, 60 (seconds), 2, 3, 4, 5, 6, 7, 8, 9, or 10 (minutes), or any combination thereof.

The ultraviolet radiation this anneal may include wavelengths of about 145 nm to about 192 nm, which includes 145, 147, 150, 155, 171, 172, 173, 175, 180, 185, 190, and 192 nm as appropriate for the binding energy of the molecule which is dissociated. The radiation may be monochromatic or polychromatic.

It may originate from an ultraviolet radiation source operating at a power of about 5 $mW/cm^2$ to about 50 $mW/cm^2$, which includes 0.5, 0.6, 0.7, 0.8, 0.9, 1, 1.1, 1.3, 1.5, 1.7, 1.9, 2, 3, 4, or 5 $W/cm^2$, or any combination thereof. One or more ultraviolet sources may be used.

The annealing and the nitriding may be carried out in the same process chamber, in which case it is possible to carry out at least one purging step is carried out after the nitriding and prior to the annealing. Of course, it is also possible to carry out nitriding and the annealing in different process chambers. In this embodiment, it is possible to transfer the film-bearing substrate from one chamber to another without contacting ambient atmosphere, air, etc.

RFN Post Anneal

The RFN post anneal alternatively suitably anneals the oxynitride film by exposing the oxynitride film to nitrogen radicals formed by an upstream plasma induced dissociation of an upstream annealing gas comprising an upstream molecular composition comprising nitrogen, and wherein said upstream plasma induced dissociation comprises using plasma generated via the coupling of radio frequency (RF) power to the upstream annealing gas, such that the nitrogen radicals flow across the surface in a laminar manner.

The annealing may be suitably carried out at a pressure of about 1 mTorr to about 20,000 mTorr, which includes 1, 2, 3, 4, 5, 6, 7, 8, 9, 10, 20, 30, 40, 50, 60, 70, 80, 90, 100, 250, 500, 750, 1,000, 10,000, 20,000 mTorr, or any combination thereof.

The annealing may be suitably carried out at a substrate temperature of about 20° C. to about 1200° C., which includes 20, 30, 40, 50, 60, 70, 80, 90, 100, 200, 300, 400, 500, 550, 600, 650, 700, 750, 800, 850, 900, 950, 1000, 1100, or 1200° C., or any combination thereof.

The annealing may be carried out is carried out for a time of about 1 second to about 25 min, which range includes 1, 2, 3, 4, 5, 6, 7, 8, 9, 10, 15, 20, 25, 30, 35, 40, 50, 60 (seconds), 2, 3, 4, 5, 6, 7, 8, 9, 10, 15, or 20 (minutes), or any combination thereof.

The annealing may be carried out under N2 at an N2 flow rate of about 2 sccm to about 20 slm, which includes 0, 1, 2, 3, 4, 5, 6, 7, 8, 9, 10, 20, 30, 35, 40, 45, 50, 55, 60, 65, 70, 75, 80, 85, 90, 100, 250, 275, 300, 400, 500, 600, 700, 800, 900, or 1000 (sccm), 2, 3, 4, 5, 10, 15, or 20 (slm), or any combination thereof.

The annealing may also be carried out in the presence of other gases, for example, H2, Ar, He, Ne, Xe, or Kr, or any combination thereof. The flow rate of these other gases may be about 100 sccm to about 20 slm, which includes 100, 250, 275, 300, 400, 500, 600, 700, 800, 900, or 1000 (sccm), 2, 3, 4, 5, 10, 15, or 20 (slm), or any combination thereof.

The annealing may be carried out using plasma remotely generated via the coupling of radio frequency (RF) power having a frequency of about 40 kHz to about 4 MHz with the upstream annealing gas, which includes 40, 50, 60, 70, 80, 90, 100, 200, 300, 400, 500, 600, 700, 800, 900, or 1000 (kHz), 1.5, 2, 3, or 4 (MHz), or any combination thereof.

Device

One embodiment includes forming semiconductor device including a poly-silicon, amorphous-silicon, or SiGe layer, or any combination thereof, on the oxynitride film.

Another embodiment includes making a semiconductor or electronic device with the present method and system.

The processes can be performed on a thin oxide formed during a wet chemical clean, e.g., chemical oxide, or on a bare Si surface formed by a clean in which the last step is a HF dip to remove all oxide.

Other suitable systems and methods are described in the following references, the entire contents of each of which are independently incorporated by reference:

JP 2001-012917, filed Jan. 22, 2001;
JP 2001-374631, filed Dec. 7, 2001;
JP 2001-374632, filed Dec. 7, 2001;
JP 2001-374633, filed Dec. 7, 2001;
JP 2001-401210, filed Dec. 28, 2001;
JP 2002-118477, filed Apr. 19, 2002;
US 2004/0142577 A1, filed Jan. 22, 2002; and
US 2003/0170945 A1, filed Dec. 6, 2002.

The present invention is not limited to the above embodiments and may be practiced or embodied in still other ways without departing from the scope and spirit thereof.

What is claimed is:

1. A method for preparing an oxynitride film on a substrate comprising:

forming the oxynitride film by exposing a surface of the substrate to oxygen radicals and nitrogen radicals, the oxygen radicals and the nitrogen radicals being formed by plasma induced dissociation of a process gas consisting of a first gas selected from the group consisting of NO, $NO_2$, or $N_2O$, or any combination thereof, and an optional second gas selected from the group consisting of $H_2$, Ar, He, Ne, Xe, or Kr, or any combination thereof using plasma based on microwave irradiation via a plane antenna member having a plurality of slits, and annealing the oxynitride film by exposing the oxynitride film to oxygen radicals and nitrogen radicals formed by ultraviolet (UV) radiation induced dissociation of an annealing gas comprising at least one molecular composition comprising oxygen and nitrogen.

2. The method of claim 1, wherein the oxynitride film has a thickness of about 0.1 nm to about 5 nm.

3. The method of claim 1, wherein the oxynitride film has a thickness variation σ of about 0.7% to about 4%.

4. The method of claim 1, further comprising rotating, during the forming, the substrate in the plane of the substrate surface at a rate of about 1 rpm to about 60 rpm.

5. The method of claim 1, wherein the exposing is carried out at a substrate temperature of about 20° C. to about 1000° C.

6. The method of claim 1, wherein the exposing is carried out at a pressure of about 1 mTorr to about 20,000 mTorr.

7. The method of claim 1, wherein the exposing is carried out at a process gas flow rate of about 5 sccm to about 5 slm.

8. The method of claim 1, wherein the exposing is carried out for a time of about 5 seconds to about 25 minutes.

9. The method of claim 1, wherein the plasma comprises an electron temperature of less than about 3 eV.

10. The method of claim 1, wherein the plasma has a density of about $1 \times 10^{11}/cm^3$ to about $1 \times 10^{13}/cm^3$ and density uniformity of about ±3% or less.

11. The method of claim 1, wherein the oxynitride film has a surface nitrogen concentration of about 20% or less.

12. The method of claim 1, wherein the plasma is generated by a microwave output of about 0.5 $W/cm^2$ to about 5 $W/cm^2$.

13. The method of claim 1, wherein the microwave irradiation comprises a microwave frequency of about 300 MHz to about 10 GHz.

14. The method of claim 1, wherein the plane antenna member comprises a surface area on a surface thereof that is larger than the area of the substrate surface.

15. The method of claim 1, wherein the oxynitride film has the formula SiON.

16. The method of claim 1, wherein the substrate surface is a silicon surface, an oxide surface, or a silicon oxide surface.

17. The method of claim 1, wherein the annealing comprises annealing the oxynitride film at a pressure of about 5 mTorr to about 800 Torr.

18. The method of claim 1, wherein the annealing comprises annealing the oxynitride film at a temperature of about 500° C. to about 1200° C.

19. The method of claim 1, wherein the annealing comprises annealing the oxynitride film under an annealing gas comprising at least one molecular composition comprising oxygen, nitrogen, $H_2$, Ar, He, Ne, Xe, or Kr, or any combination thereof.

20. The method of claim 1, wherein the molecular composition comprises $N_2$ at an $N_2$ flow rate of about 0 slm to about 20 slm.

21. The method of claim 1, wherein the molecular composition comprises $O_2$ at an $O_2$ flow rate of about 0 slm to about 20 slm.

22. The method of claim 1, wherein the annealing of the oxynitride film occurs for a time of about 1 second to about 10 minutes.

23. The method of claim 1, wherein the exposing and the annealing are carried out in the same process chamber, and at least one purging step is carried out after the exposing and prior to the annealing.

24. The method of claim 1, wherein the exposing and the annealing are carried out in different process chambers.

25. The method of claim 1, wherein the exposing is carried out in a first process chamber, and the annealing is carried in a second Process chamber, and wherein the oxynitride film is transferred from the first chamber to the second chamber without contacting the oxynitride film with air.

26. The method of claim 1, wherein the annealing molecular composition comprises oxygen and nitrogen selected from the group consisting of $O_2$, $N_2$, NO, $NO_2$, or $N_2O$, or any combination thereof.

27. The method of claim 1, wherein the annealing molecular composition comprises oxygen and nitrogen and at least one selected from the group consisting of $H_2$, Ar, He, Ne, Xe, or Kr, or any combination thereof.

28. The method of claim 1, wherein the annealing gas flows across the oxynitride surface such that the oxygen and nitrogen radicals are comprised within a laminar flow of the annealing gas across the oxynitride surface.

29. The method of claim 1, wherein, during the annealing, the substrate is rotated in the plane of the substrate surface at a rate of about 1 rpm to about 60 rpm.

30. The method of claim 1, wherein the annealing is carried out at a pressure of about 1 mTorr to about 80,000 mTorr.

31. The method of claim 1, wherein the annealing is carried out at a temperature of about 400° C. to about 1200° C.

32. The method of claim 1, wherein the annealing gas has a flow rate of about 0 slm to about 20 slm.

33. The method of claim 1, wherein the ultraviolet radiation in the ultraviolet radiation induced dissociation comprises ultraviolet radiation in a range of about 145 nm to about 192 nm and is monochromatic or polychromatic.

34. The method of claim 1, wherein the ultraviolet radiation in the ultraviolet radiation induced dissociation originates from an ultraviolet radiation source operating at a power of about 5 W/cm$^2$ to about 50 mW/cm$^2$.

35. The method of claim 1, wherein the ultraviolet radiation in the ultraviolet radiation induced dissociation originates from two or more ultraviolet radiation sources.

36. The method of claim 1, further comprising forming at least one selected from the group consisting of poly-silicon, amorphous-silicon, and SiGe, or any combination thereof, on the oxynitride film.

37. A method for making a semiconductor or electronic device, comprising the method of claim 1.

* * * * *